(12) United States Patent
Wu et al.

(10) Patent No.: US 10,593,286 B2
(45) Date of Patent: Mar. 17, 2020

(54) SHIFT REGISTER, GATE DRIVING CIRCUIT, DISPLAY PANEL AND DRIVING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Bo Wu, Beijing (CN); Wen Tan, Beijing (CN); Zhenxiao Tong, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 163 days.

(21) Appl. No.: 15/704,627

(22) Filed: Sep. 14, 2017

(65) Prior Publication Data
US 2018/0151148 A1    May 31, 2018

(30) Foreign Application Priority Data

Nov. 29, 2016  (CN) .......................... 2016 1 1073026

(51) Int. Cl.
*G11C 19/00*  (2006.01)
*G09G 5/00*  (2006.01)
(Continued)

(52) U.S. Cl.
CPC ............... *G09G 5/003* (2013.01); *G09G 3/20* (2013.01); *G11C 19/184* (2013.01);
(Continued)

(58) Field of Classification Search
None
See application file for complete search history.

(56) References Cited

U.S. PATENT DOCUMENTS 8,019,039 B1 *  9/2011  Tsai ...................... G11C 19/28
377/64
9,824,656 B2 * 11/2017  Chen .................... G09G 3/3648
(Continued)

FOREIGN PATENT DOCUMENTS

CN  102956186 A  3/2013
CN  103137061 A  6/2013
(Continued)

OTHER PUBLICATIONS

The First Chinese Office Action dated Jan. 2, 2019; Appln. No. 201611073026.4.
(Continued)

*Primary Examiner* — Tuan T Lam

(57) ABSTRACT

A shift register, a gate driving circuit, a display panel and a driving method. The shift register includes: an input and set circuit, connected with a pull-up node; a storage circuit, connected with the pull-up node and an output end respectively; an output circuit, configured to provide a second clock signal to the output end when a voltage of the pull-up node satisfies an output condition; and a first pull-down circuit, configured to provide a first power voltage to the output end when a first pull-down condition is satisfied. The input and set circuit is further configured to: in a set stage of forward scanning or an input stage of reverse scanning, receive a third clock signal and a second input signal, and in response to the third clock signal, write a voltage of the second input signal into the pull-up node.

13 Claims, 8 Drawing Sheets

(51) Int. Cl.
  *G09G 3/20* (2006.01)
  *G11C 19/18* (2006.01)
  *G11C 19/28* (2006.01)
  *G09G 3/36* (2006.01)

(52) U.S. Cl.
  CPC ... *G09G 3/3677* (2013.01); *G09G 2300/0408* (2013.01); *G09G 2300/0426* (2013.01); *G09G 2310/0251* (2013.01); *G09G 2310/0267* (2013.01); *G09G 2310/0283* (2013.01); *G09G 2310/0286* (2013.01); *G09G 2310/061* (2013.01); *G09G 2310/08* (2013.01); *G09G 2330/021* (2013.01); *G11C 19/28* (2013.01)

(56) References Cited

U.S. PATENT DOCUMENTS

| | | | |
|---|---|---|---|
| 9,875,709 B2* | 1/2018 | Li | G09G 3/36 |
| 2008/0012818 A1 | 1/2008 | Lee et al. | |
| 2011/0157124 A1* | 6/2011 | Jung | G11C 19/28 |
| | | | 345/211 |
| 2011/0221736 A1 | 9/2011 | Pak et al. | |
| 2012/0188210 A1* | 7/2012 | Zhang | G09G 3/3677 |
| | | | 345/204 |
| 2014/0055333 A1* | 2/2014 | Lin | G09G 3/3611 |
| | | | 345/100 |
| 2014/0086379 A1* | 3/2014 | Ma | G11C 19/28 |
| | | | 377/64 |
| 2014/0119491 A1* | 5/2014 | Liu | G11C 19/28 |
| | | | 377/64 |
| 2014/0126684 A1 | 5/2014 | Ma et al. | |
| 2015/0043703 A1* | 2/2015 | Tan | G11C 19/28 |
| | | | 377/68 |
| 2015/0302935 A1* | 10/2015 | Zeng | G09G 3/20 |
| | | | 377/64 |
| 2016/0071614 A1* | 3/2016 | Lee | G09G 5/006 |
| | | | 345/214 |
| 2016/0086562 A1* | 3/2016 | Tan | G09G 3/3677 |
| | | | 345/215 |
| 2016/0125954 A1* | 5/2016 | Gu | G11C 19/28 |
| | | | 377/64 |
| 2016/0133337 A1* | 5/2016 | Gu | G11C 19/28 |
| | | | 377/64 |
| 2016/0189795 A1 | 6/2016 | Chen | |
| 2016/0225336 A1* | 8/2016 | Gu | G11C 19/28 |
| 2016/0268004 A1* | 9/2016 | Li | G11C 19/28 |
| 2016/0275847 A1 | 9/2016 | Lin et al. | |
| 2016/0300623 A1* | 10/2016 | Yang | G11C 19/28 |
| 2016/0314850 A1* | 10/2016 | Gu | G11C 19/28 |
| 2016/0351156 A1 | 12/2016 | Wu et al. | |
| 2016/0372070 A1* | 12/2016 | Hu | G09G 3/3614 |
| 2017/0169769 A1* | 6/2017 | Fletcher | G09G 3/3648 |
| 2017/0193957 A1* | 7/2017 | Liu | G09G 3/3696 |
| 2017/0221441 A1 | 8/2017 | Gu et al. | |
| 2017/0285374 A1* | 10/2017 | Li | G02F 1/1303 |

FOREIGN PATENT DOCUMENTS

| | | |
|---|---|---|
| CN | 203746393 U | 7/2014 |
| CN | 104318909 A | 1/2015 |
| CN | 104464605 A | 3/2015 |
| CN | 105047168 A | 11/2015 |
| CN | 105355187 A | 2/2016 |
| CN | 105913793 A | 8/2016 |
| CN | 106033683 A | 10/2016 |
| KR | 1020140014746 A | 2/2014 |

OTHER PUBLICATIONS

The Second Chinese Office Action dated Jun. 28, 2019; Appln. No. 201611073026.4.

* cited by examiner

SHIFT REGISTER, GATE DRIVING CIRCUIT, DISPLAY PANEL AND DRIVING METHOD

TECHNICAL FIELD

Embodiments of the present disclosure relate to a shift register, a gate driving circuit, a display panel and a driving method.

BACKGROUND

Along with rapid development of display technologies, display panels are developed increasingly towards a trend of high integration and low cost. A Gate-Driver on Array (GOA) technology includes that a gate driving circuit is directly integrated on an array substrate of a display apparatus through a photolithography process. A GOA circuit generally includes a plurality of cascaded shift registers, and each shift register corresponds to a gate line corresponding to one row of pixels (e.g., each shift register provides a scanning driving signal to a gate line corresponding to one row of pixels), so as to implement scanning driving on the display panel. Such an integration technology can save spaces of a bonding region and a fan-out region of a gate Integrated Circuit (IC) so as to achieve a narrow frame of the display panel, and meanwhile, can reduce product cost and improve a yield rate of the products.

SUMMARY

Embodiments of the disclosure provide a shift register, comprising: an input and set circuit, connected with a pull-up node and configured to: in an input stage of forward scanning or a set stage of reverse scanning, receive a first clock signal and a first input signal, and in response to the first clock signal, write a voltage of the first input signal into the pull-up node; a storage circuit, connected with the pull-up node and an output end respectively; an output circuit, configured to provide a second clock signal to the output end when a voltage of the pull-up node satisfies an output condition; and a first pull-down circuit, configured to provide a first power voltage to the output end when a first pull-down condition is satisfied. The input and set circuit is further configured to: in a set stage of forward scanning or an input stage of reverse scanning, receive a third clock signal and a second input signal, and in response to the third clock signal, write a voltage of the second input signal into the pull-up node.

For example, in the shift register provided in embodiments of the disclosure, the output circuit includes a first transistor, a first electrode of the first transistor is configured to receive the second clock signal, a second electrode of the first transistor is connected with the output end, and a gate electrode of the first transistor is connected with the pull-up node.

For example, in the shift register provided in embodiments of the disclosure, the storage circuit includes a first capacitor, a first end of the first capacitor is connected with the pull-up node, and a second end of the first capacitor is connected with the output end.

For example, in the shift register provided in embodiments of the disclosure, the input and set circuit includes a second transistor and a third transistor, a first electrode of the second transistor is connected with a first input signal end to receive the first input signal, a second electrode of the second transistor is connected with the pull-up node, and a gate electrode of the second transistor is connected with a first clock signal end to receive the first clock signal; and a first electrode of the third transistor is connected with a second input signal end to receive the second input signal, a second electrode of the third transistor is connected with the pull-up node, and a gate electrode of the third transistor is connected with a third clock signal end to receive the third clock signal.

For example, in the shift register provided in embodiments of the disclosure, the first pull-down circuit includes a fourth transistor, a fifth transistor and a second capacitor, a first electrode of the fourth transistor is connected with a first power supply end to receive the first power voltage, a second electrode of the fourth transistor is connected with a first pull-down node, and a gate electrode of the fourth transistor is connected with the pull-up node; and a first electrode of the fifth transistor is connected with the first power supply end to receive the first power voltage, a second electrode of the fifth transistor is connected with the output end, and a gate electrode of the fifth transistor is connected with the first pull-down node; and a first end of the second capacitor is connected with a second clock signal end to receive the second clock signal, and a second end of the second capacitor is connected with the first pull-down node.

For example, the shift register provided by embodiments of the disclosure further comprises a second pull-down circuit, configured to provide the first power voltage to the output end when a second pull-down condition is satisfied.

For example, in the shift register provided in embodiments of the disclosure, the second pull-down circuit includes a sixth transistor, a first electrode of the sixth transistor is connected with the first power supply end to receive the first power voltage, a second electrode of the sixth transistor is connected with the output end, and a gate electrode of the sixth transistor is connected with a fourth clock signal end to receive a fourth clock signal.

For example, in the shift register provided in embodiments of the disclosure, the second pull-down circuit includes a seventh transistor, an eighth transistor and a third capacitor, a first electrode of the seventh transistor is connected with the first power supply end to receive the first power voltage, a second electrode of the seventh transistor is connected with the output end, and a gate electrode of the seventh transistor is connected with a second pull-down node; a first electrode of the eighth transistor is connected with the first power supply end to receive the first power voltage, a second electrode of the eighth transistor is connected with the second pull-down node, and a gate electrode of the eighth transistor is connected with the pull-up node; and a first end of the third capacitor is connected with the fourth clock signal end to receive the fourth clock signal, and a second end of the third capacitor is connected with the second pull-down node.

Embodiments of the disclosure further provide a gate driving circuit, comprising the shift register above.

For example, the gate driving circuit provided by embodiments of the disclosure comprises a plurality of cascaded shift registers, wherein except for a first-stage shift register and a last-stage shift register, a first input signal end of a current-stage shift register is connected with an output end of a previous-stage shift register; and a second input signal end of the current-stage shift register is connected with an output end of a next-stage shift register.

Embodiments of the disclosure further provide a display panel, comprising the gate driving circuit described above.

For example, the display panel provided by embodiments of the disclosure further comprises gate lines, data lines and a plurality of pixel units defined by intersection of the gate lines and the data lines, the gate driving circuit being configured to provide gate driving signals to the gate lines.

Embodiments of the disclosure further provide a driving method for the shift register described above, comprising: executing operations of a forward scanning mode or executing operations of a reverse scanning mode, wherein: the forward scanning mode includes a first reset stage, a first initialization stage, an input stage, an output stage, a set stage, a second initialization stage, a second reset stage and a third initialization stage; and the reverse scanning mode includes a first initialization stage, a first reset stage, a second initialization stage, an input stage, an output stage, a set stage, a third initialization stage and a second reset stage.

For example, in the driving method provided by embodiments of the disclosure, executing the operations of the forward scanning mode includes: in the first reset stage, resetting a voltage of a pull-up node as a low level; in the first initialization stage, initializing a voltage of an output end into the low level; in the input stage, setting the voltage of the pull-up node as a pre-charge voltage level; in the output stage, setting the voltage of the pull-up node as a bootstrap voltage level, and setting the voltage of the output end as a high level; in the set stage, setting the voltage of the pull-up node as the pre-charge voltage level, and setting the voltage of the output end as the low level; in the second initialization stage, initializing the voltage of the output end into the low level; in the second reset stage, resetting the voltage of the pull-up node as the low level; and in the third initialization stage, initializing the voltage of the output end into the low level.

For example, in the driving method provided by embodiments of the disclosure, executing the operations of the reverse scanning mode includes: in the first initialization stage, initializing the voltage of the output end into a low level; in the first reset stage, resetting the voltage of the pull-up node as the low level; in the second initialization stage, initializing the voltage of the output end into the low level; in the input stage, setting the voltage of the pull-up node as a pre-charge voltage level; in the output stage, setting the voltage of the pull-up node as a bootstrap voltage level, and setting the voltage of the output end as a high level; in the set stage, setting the voltage of the pull-up node as the pre-charge voltage level, and setting the voltage of the output end as the low level; in the third initialization stage, initializing the voltage of the output end into the low level; and in the second reset stage, resetting the voltage of the pull-up node as the low level.

BRIEF DESCRIPTION OF THE DRAWINGS

In order to illustrate the technical solutions in the embodiments of the present disclosure more clearly, the drawings needed to be used in the description of the embodiments will be briefly described in the following. It is obvious that the drawings described below are only related to some embodiments of the present disclosure, and are not intended to be limitative to the disclosure.

DETAILED DESCRIPTION

Figure 1:
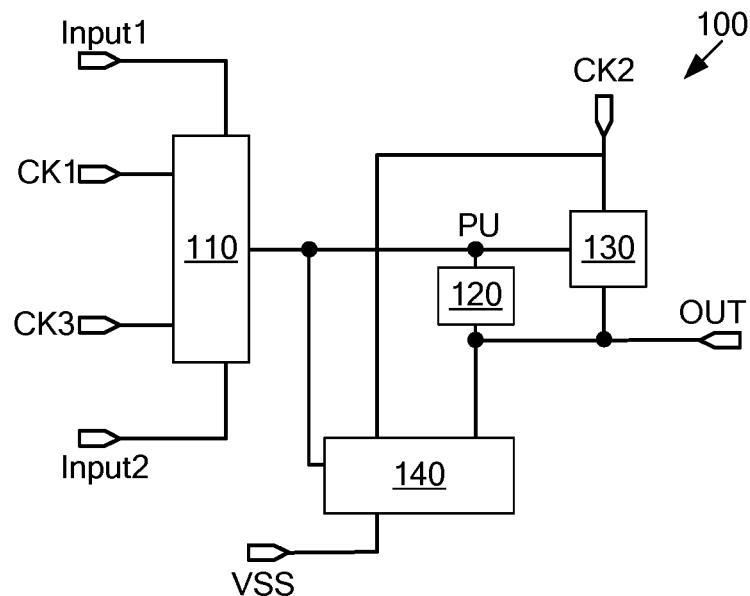
FIG. 1 is a first schematic diagram of a shift register provided by an embodiment of the present disclosure.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

A shift register, a gate driving circuit, a display panel and a driving method which are provided by embodiments of the present disclosure can implement bidirectional scanning, reduce fluctuation of an output signal caused by clock hopping, and reduce a ratio of a turn-on time of a transistor so as to reduce drift of a threshold voltage of the transistor. For example, the shift register and the gate driving circuit which are provided by the embodiments of the present disclosure are simple in driving approaches, have a small quantity of thin film transistors and low in power consumption, and can implement a narrow frame of the display panel.

An embodiment of the present disclosure provides a shift register, including an input and set circuit connected with a pull-up node and configured to: in an input stage of forward scanning or a set stage of reverse scanning, receive a first clock signal and a first input signal, and in response to the first clock signal, write a voltage of the first input signal into the pull-up node. The shift register further includes: a storage circuit, connected with the pull-up node and an output end respectively; an output circuit, configured to provide a second clock signal to the output end when a voltage of the pull-up node satisfies an output condition; and a first pull-down circuit, configured to provide a first power voltage to the output end when a first pull-down condition is satisfied. The input and set circuit is further configured to: in a set stage of forward scanning or an input stage of reverse scanning, receive a third clock signal and a second input signal, and in response to the third clock signal, write a voltage of the second input signal into the pull-up node.

For example, as shown in FIG. 1, an embodiment of the present disclosure provides a shift register 100. The shift register 100 includes: an input and set circuit 110, a storage circuit 120, an output circuit 130 and a first pull-down circuit 140. The input and set circuit 110 is connected with a pull-up node PU; the storage circuit 120 is respectively connected with the pull-up node PU and an output end OUT; the output circuit 130 is configured to, when a voltage of the pull-up node satisfies an output condition, provide a second clock signal CK2 to the output end OUT; and the first pull-down circuit 140 is configured to, when a first pull-down condition is satisfied, provide a first power voltage VSS to the output end OUT.

For example, the input and set circuit 110 is configured to: in an input stage of forward scanning, receive a first clock signal CK1 and a first input signal Input1, and in response to the first clock signal CK1, write a voltage of the first input signal Input1 into the pull-up node PU; and in a set stage of forward scanning, receive a third clock signal CK3 and a second input signal Input2, and in response to the third clock signal CK3, write a voltage of the second input signal Input2 into the pull-up node PU. The input and set circuit 110 is further configured to: in an input stage of reverse scanning, receive the third clock signal CK3 and the second input signal Input2, and in response to the third clock signal CK3, write the voltage of the second input signal Input2 into the pull-up node PU; and in a set stage of reverse scanning, receive the first clock signal CK1 and the first input signal Input1, and in response to the first clock signal CK1, write the voltage of the first input signal Input1 into the pull-up node PU.

Figure 2:
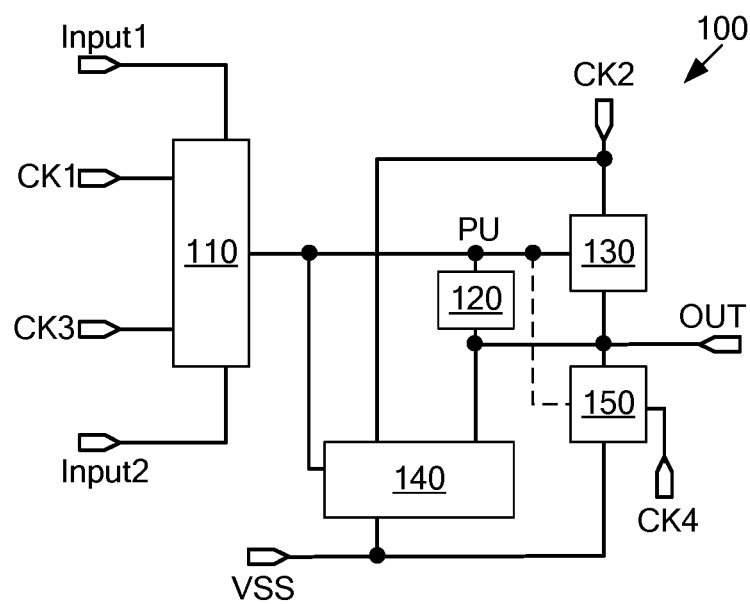
FIG. 2 is a second schematic diagram of a shift register provided by an embodiment of the present disclosure.

For example, as shown in FIG. 2, a shift register 100 provided by an embodiment of the present disclosure further includes a second pull-down circuit 150. The second pull-down circuit 150 is configured to: when a second pull-down condition is satisfied, provide the first power voltage VSS to the output end OUT.

For example, the first power voltage VSS is a low level voltage (for example, 0V, −5V, −10V or other values). It should be noted that the low level voltage is described with respect to a high level voltage and may be a suitable positive voltage, a zero voltage or a negative voltage. The present disclosure is not limited thereto herein.

For example, as shown in FIG. 2, the second pull-down circuit 150 may be connected with the output end OUT, connected with a first power supply end to receive the first power voltage VSS, and connected with a fourth clock signal end to receive a fourth clock signal CK4. For another example, the second pull-down circuit 150 may also be connected with the output end OUT, connected with the first power supply end to receive the first power voltage VSS, and connected with the fourth clock signal end to receive the fourth clock signal CK4, and connected with the pull-up node PU (shown as a dotted line in FIG. 2).

Figure 3:
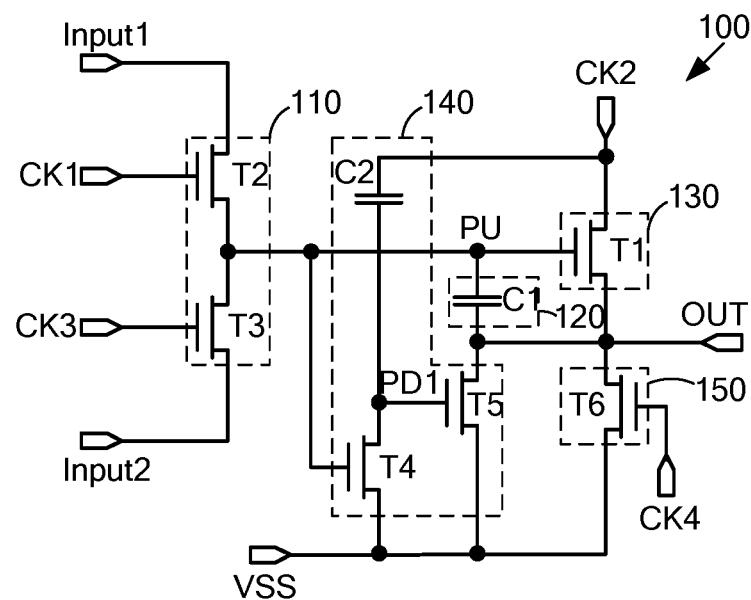
FIG. 3 is a first example of the shift register as shown in FIG. 2 provided by an embodiment of the present disclosure.

For example, as shown in FIG. 3, in the shift register 100 provided by an embodiment of the present disclosure, the output circuit 130 includes a first transistor T1, a first electrode of the first transistor T1 is connected with a second clock signal end to receive the second clock signal CK2, a second electrode of the first transistor T1 is connected with the output end OUT, and a gate electrode of the first transistor T1 is connected with the pull-up node PU.

For example, as shown in FIG. 3, in the shift register 100 provided by an embodiment of the present disclosure, the storage circuit 120 includes a first capacitor C1, a first end of the first capacitor C1 is connected with the pull-up node PU, and a second end of the first capacitor C1 is connected with the output end OUT.

For example, in the shift register 100 provided by an embodiment of the present disclosure, the input and set circuit 110 includes a second transistor T2 and a third transistor T3. A first electrode of the second transistor T2 is connected with a first input signal end to receive the first input signal Input1, a second electrode of the second transistor T2 is connected with the pull-up node PU, and a gate electrode of the second transistor T2 is connected with a first clock signal end to receive the first clock signal CK1. A first electrode of the third transistor T3 is connected with a second input signal end to receive the second input signal Input2, a second electrode of the third transistor T3 is connected with the pull-up node PU, and a gate electrode of the third transistor T3 is connected with a third clock signal end to receive the third clock signal CK3.

For example, as shown in FIG. 3, in the shift register 100 provided by an embodiment of the present disclosure, the first pull-down circuit 140 includes a fourth transistor T4, a fifth transistor T5 and a second capacitor C2. A first electrode of the fourth transistor T4 is connected with the first power supply end to receive the first power voltage VSS, a second electrode of the fourth transistor T4 is connected with a first pull-down node PD1, and a gate electrode of the fourth transistor T4 is connected with the pull-up node PU. A first electrode of the fifth transistor T5 is connected with the first power supply end to receive the first power voltage VSS, a second electrode of the fifth transistor T5 is connected with the output end OUT, and a gate electrode of the fifth transistor T5 is connected with the first pull-down node PD1. A first end of the second capacitor C2 is connected with the second clock signal end to receive the second clock signal CK2, and a second end of the second capacitor C2 is connected with the first pull-down node PD1.

For example, as shown in FIG. 3, in one example, the second pull-down circuit 150 includes a sixth transistor T6. A first electrode of the sixth transistor T6 is connected with the first power supply end to receive the first power voltage VSS, a second electrode of the sixth transistor T6 is connected with the output end OUT, and a gate electrode of the sixth transistor T6 is connected with the fourth clock signal end to receive the fourth clock signal CK4.

Figure 4:
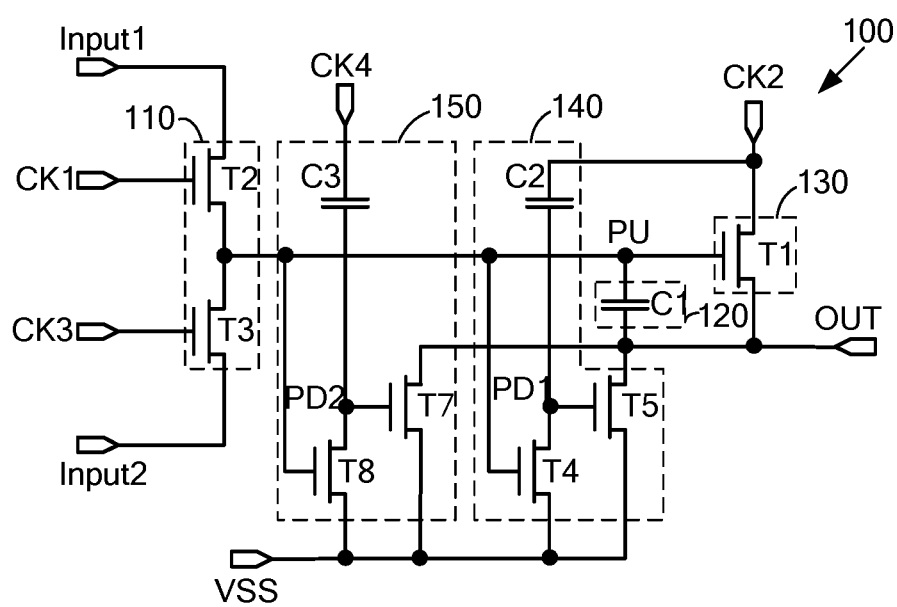
FIG. 4 is a second example of the shift register as shown in FIG. 2 provided by an embodiment of the present disclosure.

For example, as shown in FIG. 4, in another example, the second pull-down circuit 150 includes a seventh transistor T7, an eighth transistor T8 and a third capacitor C3. A first electrode of the seventh transistor T7 is connected with the first power supply end to receive the first power voltage VSS, a second electrode of the seventh transistor T7 is connected with the output end OUT, and a gate electrode of the seventh transistor T7 is connected with a second pull-down node PD2; a first electrode of the eighth transistor T8 is connected with the first power supply end to receive the first power voltage VSS, a second electrode of the eighth transistor T8 is connected with the second pull-down node PD2, and a gate electrode of the eighth transistor T8 is connected with the pull-up node PU; and a first end of the third capacitor C3 is connected with the fourth clock signal end to receive the fourth clock signal CK4, and a second end of the third capacitor C3 is connected with the second pull-down node PD2.

The second pull-down circuit 150 of the shift register shown in FIG. 4 is different in structure from the second pull-down circuit of the shift register shown in FIG. 3. Other circuits of the shift register shown in FIG. 4 are similar to those of the shift register shown in FIG. 3, and are not repeated herein.

It should be noted that the shift registers shown in FIG. 3 and FIG. 4 are only examples of the shift register provided by embodiments of the present disclosure, and are not intended to limit the embodiments of the present disclosure.

It should be noted that in the embodiments of the present disclosure, the adopted transistors may all be thin film transistors or field effect transistors or other switching devices with the same or similar characteristics. A source electrode and a drain electrode of a transistor adopted herein may be symmetric in structure, and thus, the source electrode and the drain electrode of the transistor may have no difference in structure. In the embodiments of the present disclosure, in order to distinguish two electrodes of the transistor except for the gate electrode, one electrode is directly described as the first electrode, and the other electrode is directly described as the second electrode, and thus, in the embodiments of the present disclosure, the first electrodes and the second electrodes of all or part of the transistors can be interchanged as needed. For example, according to the embodiments of the present disclosure, the first electrode of the transistor may be the source electrode, and the second electrode may be the drain electrode; or, the first electrode of the transistor is the drain electrode, and the second electrode is the source electrode. Moreover, according to the characteristics of the transistors, the transistors may be distinguished into N-type and P-type transistors. When the transistors are the P-type transistors, a turn-on voltage is a low level voltage (for example, 0V, minus 5V or other values), and a turn-off voltage is a high level voltage (for example, 5V or other values); and when the transistors are N-type transistors, the turn-on voltage is a high level voltage (for example, 5V or other values), and the turn-off voltage is a low level voltage (for example, 0V, minus 5V or other values). The embodiments of the present disclosure are illustrated by taking a case that the first transistor T1, the second transistor T2, the third transistor T3, the fourth transistor T4, the fifth transistor T5, the sixth transistor T6, the seventh transistor T7 and the eighth transistor T8 are all N-type transistors as an example. Based on descriptions and instructions on the implements of the present disclosure, those skilled in the art, without any inventive work, can easily think of implementations when the embodiments of the present disclosure adopt P-type transistors or combination of the N-type and P-type transistors, and thus, those implementations shall also fall within the scope of the present disclosure.

Figure 5:
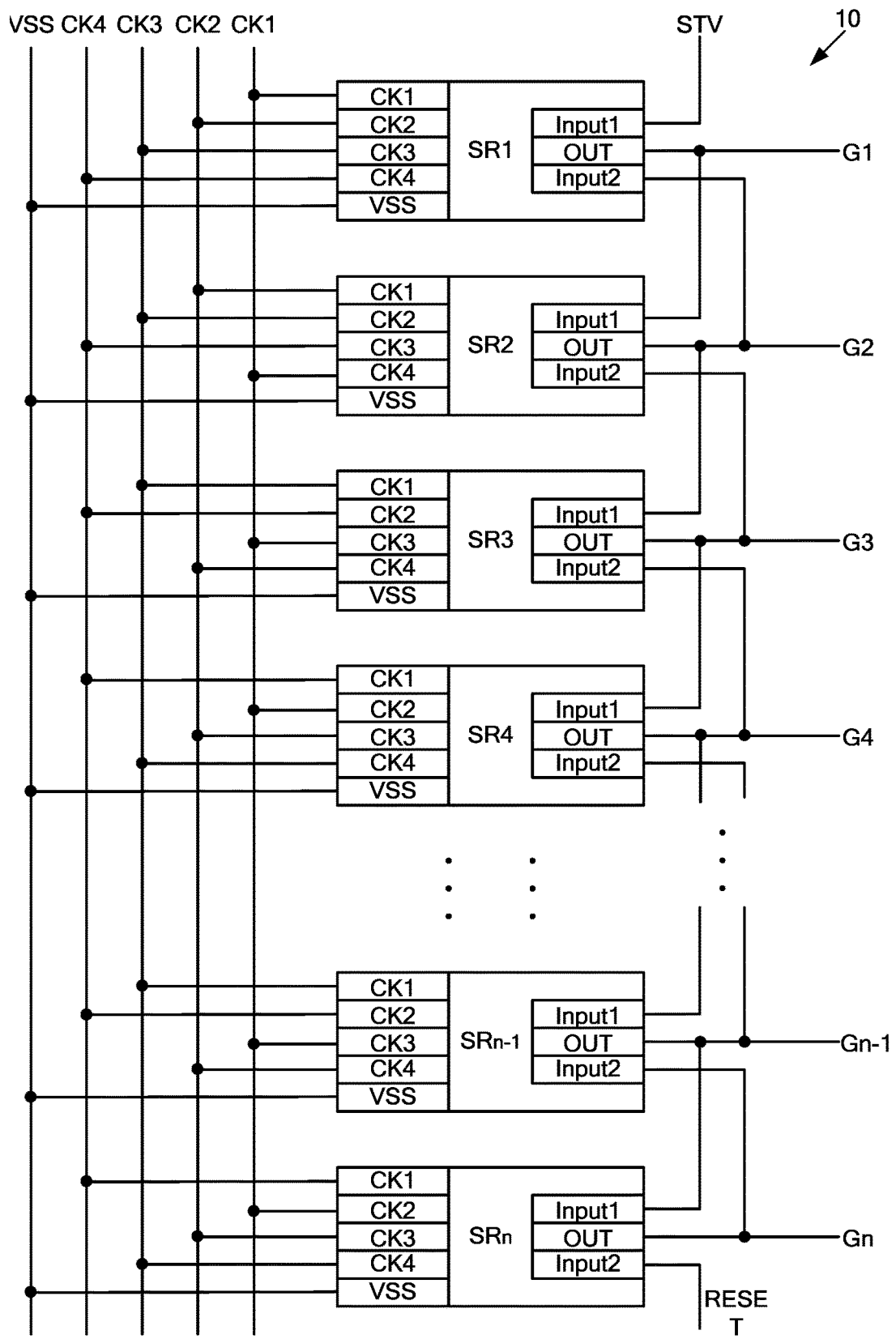
FIG. 5 is a schematic diagram of a gate driving circuit provided by an embodiment of the present disclosure.

An embodiment of the present disclosure further provides a gate driving circuit 10. As shown in FIG. 5, the gate driving circuit 10 includes the shift register provided by any one embodiment of the present disclosure.

For example, the gate driving circuit 10 provided by embodiments of the present disclosure includes a plurality of cascaded shift registers 100 (for example, n shift registers) provided by any one embodiment of the present disclosure. Except for a first-stage shift register 100 and a last-stage shift register 100, a first input signal end of a current-stage shift register 100 is connected with an output end OUT of a previous-stage shift register 100; and a second input signal end of the current-stage shift register 100 is connected with an output end OUT of a next-stage shift register 100. For example, a first input signal end of the first-stage shift register is connected with a first trigger signal end to receive a first trigger signal STV; a second input signal end of the last-stage shift register is connected with a second trigger signal end to receive a second trigger signal RESET.

For example, the gate driving circuit 10 includes n stages of shift registers SR1, SR2, . . . , SRn, and those shift registers SR1, SR2, SRn can all be a shift register 100 provided by any one embodiment of the present disclosure. The output ends of the shift registers SR1, SR2, . . . , SRn are respectively and correspondingly connected with gate lines G1, G2, . . . , Gn.

It should be noted that the gate driving circuit 10 provided by embodiments of the present disclosure can implement forward scanning and reverse scanning. When a scanning direction is switched, a "previous stage" and a "next stage" in timing may be correspondingly changed, and thus, the "previous stage" and the "next stage" do not mean a previous stage and a next stage in scanning timing, but mean a previous stage and a next stage in physical connection.

Figure 6:
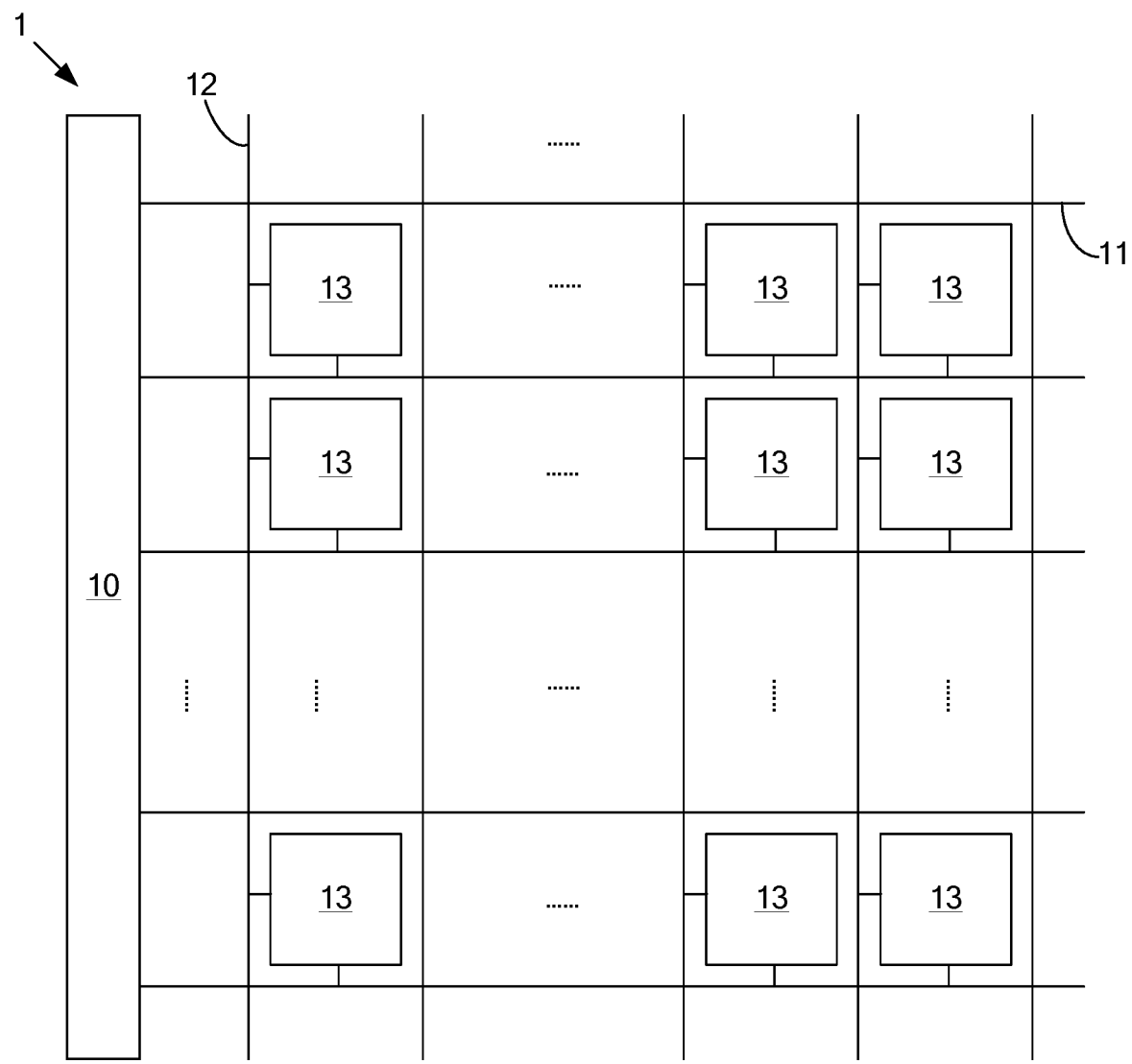
FIG. 6 is a schematic diagram of a display panel provided by an embodiment of the present disclosure.

An embodiment of the present disclosure further provides a display panel 1. As shown in FIG. 6, the display panel 1 includes the gate driving circuit 10 provided by any one embodiment of the present disclosure.

For example, the display panel 1 provided by embodiments of the present disclosure further includes gate lines 11, data lines 12, and a plurality of pixel units 13 defined by intersection of the gate lines 11 and the data lines 12. The gate driving circuit 10 is configured to provide gate driving signals to the gate lines 11.

For example, the gate lines 11 may include gate lines G1, G2, . . . , Gn shown in FIG. 5, and each stage of shift register in the shift registers SR1, SR2, . . . , SRn is used for outputting a gate driving signal for one row of pixels to the corresponding gate line in the gate lines G1, G2, . . . , Gn.

Figure 7:
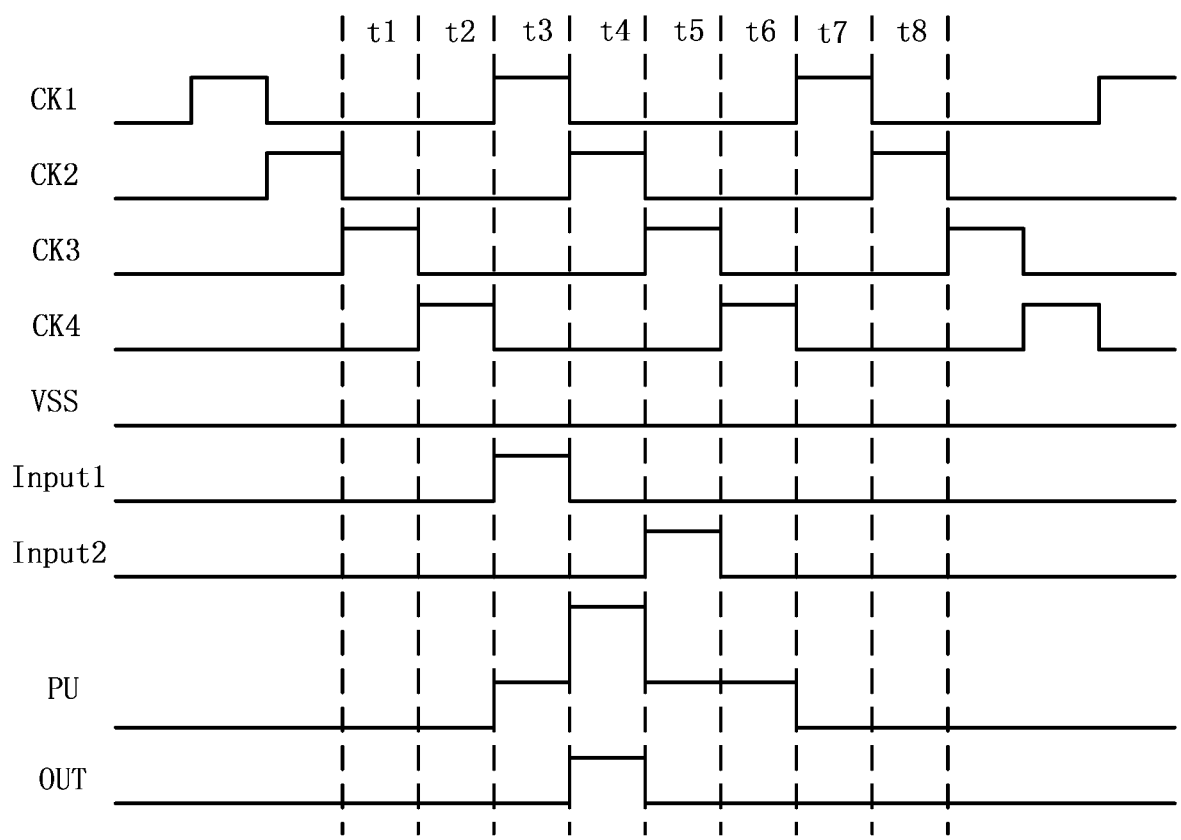
FIG. 7 is a driving timing diagram for a forward scanning mode of the shift register as shown in FIG. 3 or FIG. 4 provided by an embodiment of the present disclosure.
Figure 8:
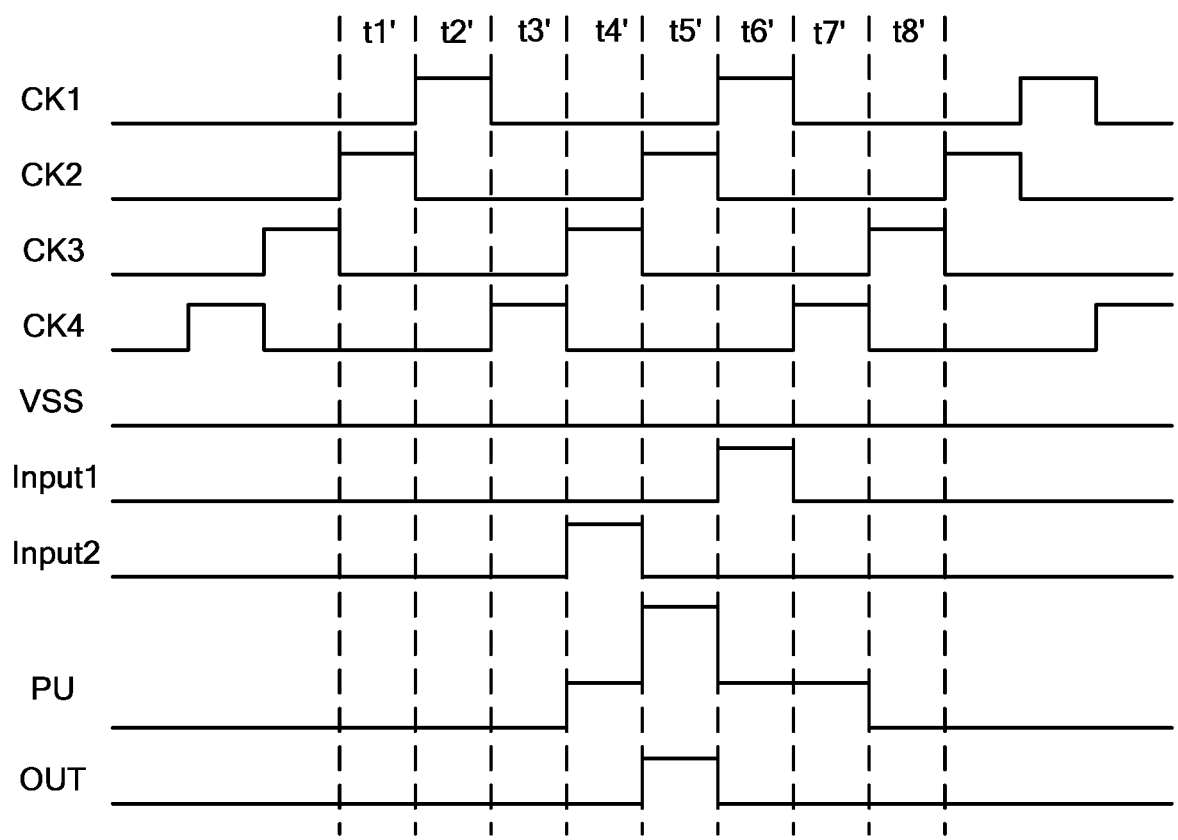
FIG. 8 is a driving timing diagram of a reverse scanning mode of the shift register as shown in FIG. 3 or FIG. 4 provided by an embodiment of the present disclosure.

An embodiment of the present disclosure further provides a driving method for a shift register 100, including: executing operations of a forward scanning mode or executing operations of a reverse scanning mode. As shown in FIG. 7, the forward scanning mode includes a first reset stage t1, a first initialization stage t2, an input stage t3, an output stage t4, a set stage t5, a second initialization stage t6, a second reset stage t7 and a third initialization stage t8. As shown in FIG. 8, the reverse scanning mode includes a first initialization stage t1', a first reset stage t2', a second initialization stage t3', an input stage t4', an output stage t5', a set stage t6', a third initialization stage t7' and a second reset stage t8'.

For example, a turn-on voltage in embodiments of the present disclosure refers to a voltage capable of conducting the first electrode and the second electrode of the corresponding transistor, and a turn-off voltage means a voltage capable of disconnecting the first electrode from the second electrode of the corresponding transistor. When a transistor is a P-type transistor, the turn-on voltage is a low voltage, and the turn-off voltage is a high voltage; and when the transistor is an N-type transistor, the turn-on voltage is a high voltage, and the turn-off voltage is a low voltage. Driving waveforms shown in FIG. 7 and FIG. 8 are both illustrated by taking N-type transistors as an example, i.e., the turn-on voltage is a high voltage, and the turn-off voltage is a low voltage.

For example, the driving method provided by embodiments of the present disclosure will be illustrated by taking the shift register shown in FIG. 3 as an example in the following.

For example, as shown in FIG. 7, in the driving method provided by embodiments of the present disclosure, executing the operations of the forward scanning mode includes:

In the first reset stage t1, resetting a voltage of the pull-up node to be a low level;

In the first initialization stage t2, initializing a voltage of the output end to a low level;

In the input stage t3, pulling up the voltage of the pull-up node to a pre-charge voltage level;

In the output stage t4, pulling up the voltage of the pull-up node to a bootstrap voltage level, and outputting a high level from the output end;

In the set stage t5, pulling down the voltage of the pull-up node to the pre-charge voltage level, and setting the voltage of the output end to be a low level;

In the second initialization stage t6, initializing the voltage of the output end to a low level;

In the second reset stage t7, resetting the voltage of the pull-up node to be a low level; and In the third initialization stage t8, initializing the voltage of the output end to a low level.

For example, in the first reset stage t1, a voltage of the first clock signal CK1 is a turn-off voltage, a voltage of the second clock signal CK2 is a turn-off voltage, a voltage of the third clock signal CK3 is a turn-on voltage, a voltage of the fourth clock signal CK4 is a turn-off voltage, a voltage of the first input signal Input1 is a turn-off voltage, and a voltage of the second input signal Input2 is a turn-off voltage. The third transistor T3 is turned on, the rest of the transistors are turned off, and the third transistor T3 writes the low level voltage of the second input signal Input2 into the pull-up node PU. In such a case, the voltage of the pull-up node PU is reset as the low level.

For example, in the first initialization stage t2, the voltage of the first clock signal CK1 is a turn-off voltage, the voltage of the second clock signal CK2 is a turn-off voltage, the voltage of the third clock signal CK3 is a turn-off voltage, the voltage of the fourth clock signal CK4 is a turn-on voltage, the voltage of the first input signal Input1 is a turn-off voltage, and the voltage of the second input signal Input2 is a turn-off voltage. The sixth transistor T6 is turned on, the rest of the transistors are turned off, and the sixth transistor T6 writes the first power voltage VSS with a low level into the output end. In such a case, the voltage of the output end OUT is initialized to the low level. For example, the second pull-down condition described in the embodiments of the present disclosure is that the voltage of the fourth clock signal CK4 is a turn-on voltage.

For example, in the input stage t3, the voltage of the first clock signal CK1 is a turn-on voltage, the voltage of the second clock signal CK2 is a turn-off voltage, the voltage of the third clock signal CK3 is a turn-off voltage, the voltage of the fourth clock signal CK4 is a turn-off voltage, the voltage of the first input signal Input1 is a turn-on voltage, and the voltage of the second input signal Input2 is a turn-off voltage. The first transistor T1, the second transistor T2 and the fourth transistor T4 are turned on, the reset of the transistors are turned off, and the second transistor T2 writes the high level voltage of the first input signal Input1 into the pull-up node PU. In such a case, the voltage of the pull-up node PU is set as the pre-charge voltage level, and the pre-charge voltage level, for example, is equal to the high level voltage of the first input signal Input1 (the pre-charge voltage level, for example, is a voltage level of the pull-up node PU in the input stage t3 as shown in FIG. 7).

For example, in the output stage t4, the voltage of the first clock signal CK1 is a turn-off voltage, the voltage of the second clock signal CK2 is a turn-on voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. The first transistor T1 and the fourth transistor T4 are turned on, and the rest of the transistors are turned off. For example, the first pull-down node PD1 can be set to have a low potential level through designing a size of the second capacitor C2 and a width-to-length ratio of the fourth transistor T4, so as to enable the fifth transistor T5 to be turned off. The first transistor T1 outputs the high level voltage of the second clock signal CK2 to the output end OUT, and due to the bootstrap effect of the first capacitor C1, the voltage of the pull-up node PU is raised to the bootstrap voltage level (the bootstrap voltage level is higher than the pre-charge voltage level, and the bootstrap voltage level, for example, is a level of the pull-up node PU in the output stage t4 as shown in FIG. 7), so that the first transistor T1 is more sufficiently turned on. In such a case, the voltage of the pull-up node PU is set as the bootstrap voltage level, and the voltage of the output end OUT is set as the high level. For example, an output condition described in the embodiments of the present disclosure is that the voltage of the pull-up node PU is the bootstrap voltage level.

For example, in the set stage t5, the voltage of the first clock signal CK1 is a turn-off voltage, the voltage of the second clock signal CK2 is a turn-off voltage, the voltage of the third clock signal CK3 is a turn-on voltage, the voltage of the fourth clock signal CK4 is a turn-off voltage, the voltage of the first input signal Input1 is a turn-off voltage, and the voltage of the second input signal Input2 is a turn-on voltage. The first transistor T1 and the third transistor T3 are turned on, the rest of the transistors are turned off, and the third transistor T3 writes the high level voltage of the second input signal Input2 into the pull-up node PU. In such a case, the voltage of the pull-up node PU is set as the pre-charge voltage level; and the voltage of the output end OUT is set as the low level.

For example, in the second initialization stage t6, the voltage of the first clock signal CK1 is a turn-off voltage, the voltage of the second clock signal CK2 is a turn-off voltage, the voltage of the third clock signal CK3 is a turn-off voltage, the voltage of the fourth clock signal CK4 is a turn-on voltage, the voltage of the first input signal Input1 is a turn-off voltage, and the voltage of the second input signal Input2 is a turn-off voltage. The sixth transistor T6 is turned on, the rest of the transistors are turned off, and the sixth transistor T6 writes the first power voltage VSS with the low level into the output end. In such a case, the voltage of the output end OUT is initialized to the low level.

For example, in the second reset stage t7, the voltage of the first clock signal CK1 is a turn-on voltage, the voltage of the second clock signal CK2 is a turn-off voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. The second transistor T2 is turned on, the rest of the transistors are turned off, and the second transistor T2 writes the low level voltage of the first input signal Input1 into the pull-up node PU. In such a case, the voltage of the pull-up node PU is reset as the low level.

For example, in the third initialization stage t8, the voltage of the first clock signal CK1 is a turn-off voltage, the voltage of the second clock signal CK2 is a turn-on voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. Through a coupling effect of the second capacitor C2, the first pull-down node PD1 has a high level, the fifth transistor T5 is turned on, the rest of the transistors are turned off, and the fifth transistor T5 writes the first power voltage VSS with the low level into the output end. In such a case, the voltage of the output end OUT is initialized as the low level. For example, the first pull-down condition described in the embodiments of the present disclosure, for example, is that a voltage of the first pull-down node PD1 is a turn-on voltage (e.g., a high level voltage).

For example, via the plurality of stages described above, the forward scanning mode achieves shift from the first input signal Input1 to the output signal of the output end OUT, i.e., gate driving scanning output is implemented under the control of four clocks CK1, CK2, CK3 and CK4.

For example, as shown in FIG. 8, in the driving method provided by embodiments of the present disclosure, executing the operations of the reverse scanning mode includes:

In the first initialization stage t1', initializing the voltage of the output end into a low level;

In the first reset stage t2', resetting the voltage of the pull-up node as a low level;

In the second initialization stage t3', initializing the voltage of the output end into a low level;

In the input stage t4', pulling up the voltage of the pull-up node to a pre-charge voltage level;

In the output stage t5', pulling up the voltage of the pull-up node to a bootstrap voltage level, and setting the voltage of the output end as a high level;

In the set stage t6', pulling down the voltage of the pull-up node to a pre-charge voltage level, and setting the voltage of the output end as a low level;

In the third initialization stage t7', initializing the voltage of the output end into a low level; and In the second reset stage t8', resetting the voltage of the pull-up node as a low level.

For example, in the first initialization stage t1', the voltage of the first clock signal CK1 is a turn-off voltage, the voltage of the second clock signal CK2 is a turn-on voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. Through the coupling effect of the second capacitor C2, the first pull-down node PD1 has a high level, the fifth transistor T5 is turned on, the rest of the transistors are turned off, and the fifth transistor T5 writes the first power voltage VSS with the low level into the output end. In such a case, the voltage of the output end OUT is initialized as the low level.

For example, in the first reset stage t2', the voltage of the first clock signal CK1 is a turn-on voltage, the voltage of the second clock signal CK2 is a turn-off voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. The second transistor T2 is turned on, the rest of the transistors are turned off, and the second transistor T2 writes the low level voltage of the first input signal Input1 into the pull-up node PU. In such a case, the voltage of the pull-up node PU is reset as the low level.

For example, in the second initialization stage t3', the voltage of the first clock signal CK1 is a turn-off voltage, the voltage of the second clock signal CK2 is a turn-off voltage, the voltage of the third clock signal CK3 is a turn-off voltage, the voltage of the fourth clock signal CK4 is a turn-on voltage, the voltage of the first input signal Input1 is a turn-off voltage, and the voltage of the second input signal Input2 is a turn-off voltage. The sixth transistor T6 is turned on, the rest of the transistors are turned off, and the sixth transistor T6 writes the first power voltage VSS with the low level into the output end. In such a case, the voltage of the output end OUT is initialized to the low level.

For example, in the input stage t4', the voltage of the first clock signal CK1 is a turn-off voltage, the voltage of the second clock signal CK2 is a turn-off voltage, the voltage of the third clock signal CK3 is a turn-on voltage, the voltage of the fourth clock signal CK4 is a turn-off voltage, the voltage of the first input signal Input1 is a turn-off voltage, and the voltage of the second input signal Input2 is a turn-on voltage. The first transistor T1 and the third transistor T3 are turned on, the rest of the transistors are turned off, and the third transistor T3 writes the high level voltage of the second input signal Input2 into the pull-up node PU. In such a case, the voltage of the pull-up node PU is set as the pre-charge voltage level.

For example, in the output stage t5', the voltage of the first clock signal CK1 is a turn-off voltage, the voltage of the second clock signal CK2 is a turn-on voltage, the voltage of the third clock signal CK3 is a turn-off voltage, the voltage of the fourth clock signal CK4 is a turn-off voltage, the voltage of the first input signal Input1 is a turn-off voltage, and the voltage of the second input signal Input2 is a turn-off voltage. The first transistor T1 and the fourth transistor T4 are turned on, and the rest of the transistors are turned off. For example, the first pull-down node PD1 can be set to have a low potential through designing the size of the second capacitor C2 and the width-to-length ratio of the fourth transistor T4, so as to enable the fifth transistor T5 to be turned off. The first transistor T1 outputs the high level voltage of the second clock signal CK2 to the output end OUT, and due to the bootstrap effect of the first capacitor C1, the voltage of the pull-up node PU is raised to the bootstrap voltage level (the bootstrap voltage level is higher than the pre-charge voltage level), so that the first transistor T1 is more sufficiently turned on. In such a case, the voltage of the pull-up node PU is set as the bootstrap voltage level, and the voltage of the output end OUT is set as the high level.

For example, in the set stage t6', the voltage of the first clock signal CK1 is a turn-on voltage, the voltage of the second clock signal CK2 is a turn-off voltage, the voltage of the third clock signal CK3 is a turn-off voltage, the voltage of the fourth clock signal CK4 is a turn-off voltage, the voltage of the first input signal Input1 is a turn-on voltage, and the voltage of the second input signal Input2 is a turn-off voltage. The first transistor T1, the second transistor T2 and the fourth transistor T4 are turned on, the reset of the transistors are turned off, and the second transistor T2 writes the high level voltage of the first input signal Input1 into the pull-up node PU. In such a case, the voltage of the pull-up node PU is set as the pre-charge voltage level, and the voltage of the output end OUT is set as the low level.

For example, in the third initialization stage t7', the voltage of the first clock signal CK1 is a turn-off voltage, the voltage of the second clock signal CK2 is a turn-off voltage, the voltage of the third clock signal CK3 is a turn-off voltage, the voltage of the fourth clock signal CK4 is a turn-on voltage, the voltage of the first input signal Input1 is a turn-off voltage, and the voltage of the second input signal Input2 is a turn-off voltage. The sixth transistor T6 is turned on, the rest of the transistors are turned off, and the sixth transistor T6 writes the first power voltage VSS with a low level into the output end. In such a case, the voltage of the output end OUT is initialized to the low level.

For example, in the second reset stage t8', a voltage of the first clock signal CK1 is a turn-off voltage, a voltage of the second clock signal CK2 is a turn-off voltage, a voltage of the third clock signal CK3 is a turn-on voltage, a voltage of the fourth clock signal CK4 is a turn-off voltage, a voltage of the first input signal Input1 is a turn-off voltage, and a voltage of the second input signal Input2 is a turn-off voltage. The third transistor T3 is turned on, the rest of the transistors are turned off, and the third transistor T3 writes the low level voltage of the second input signal Input2 into the pull-up node PU. In such a case, the voltage of the pull-up node PU is reset as the low level.

For example, via the plurality of stages described above, shift from the second input signal Input2 to the output signal of the output end OUT is implemented in the reverse scanning mode, i.e., gate driving scanning-output is implemented under the control of four clocks CK1, CK2, CK3 and CK4.

For example, a driving timing of the forward scanning mode of the shift register shown in FIG. 4 is the same as that of the forward scanning mode of the shift register shown in FIG. 3; and a driving timing of the reverse scanning mode of the shift register shown in FIG. 4 is the same as that of the reverse scanning mode of the shift register shown in FIG. 3.

For example, the second pull-down circuit 150 in FIG. 4 is different from that shown in FIG. 4. When a voltage of the second pull-down node PD2 is a turn-on voltage, the seventh transistor T7 is turned on, and the seventh transistor T7 writes the first power voltage VSS with the low level into the output end OUT, i.e., the voltage of the output end OUT is initialized to the low level.

Figure 9:
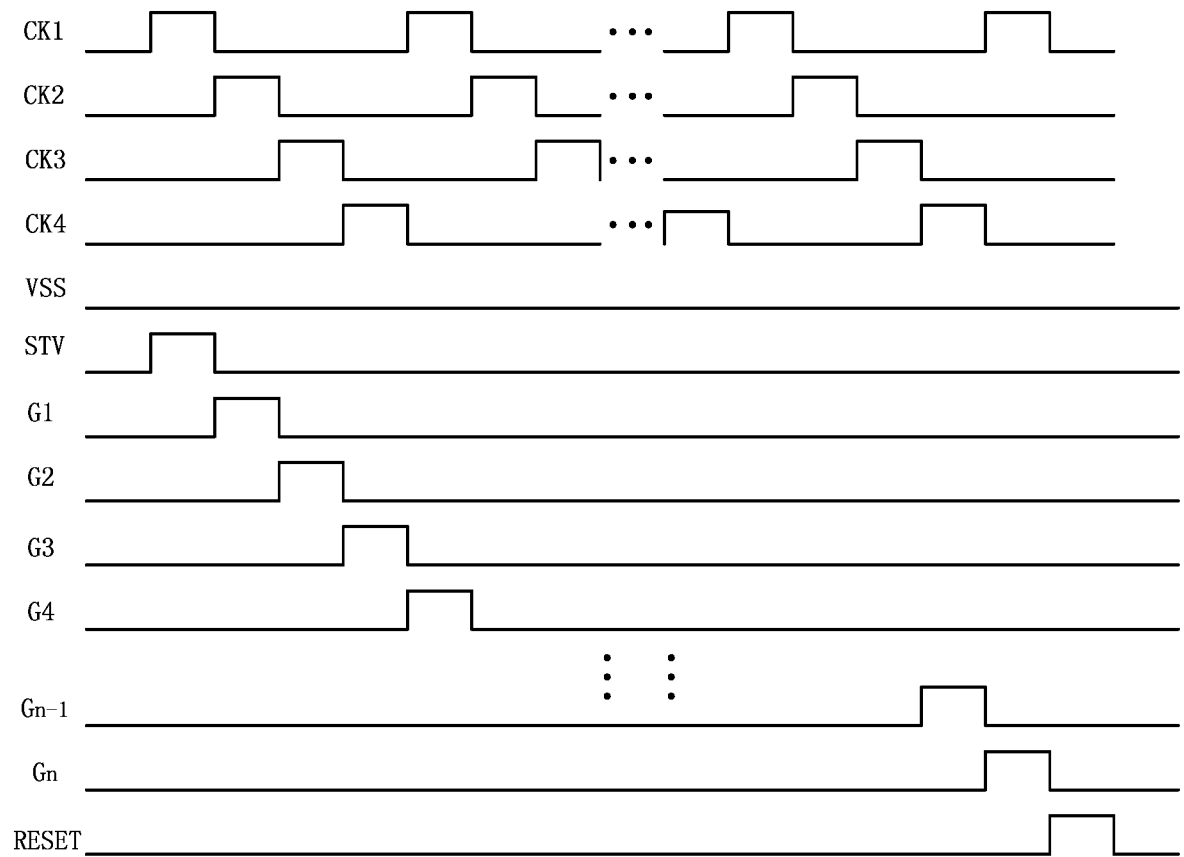
FIG. 9 is a driving timing diagram of a forward scanning mode of the gate driving circuit as shown in FIG. 5 provided by an embodiment of the present disclosure.

For example, FIG. 9 is a timing diagram of the forward scanning mode of the gate driving circuit as shown in FIG. 5 provided by embodiments of the present disclosure, and each stage of shift register in the shift registers SR1, SR2, . . . , SRn can sequentially output a gate driving signal to a corresponding gate line of the gate lines G1, G2, . . . , Gn.

Figure 10:
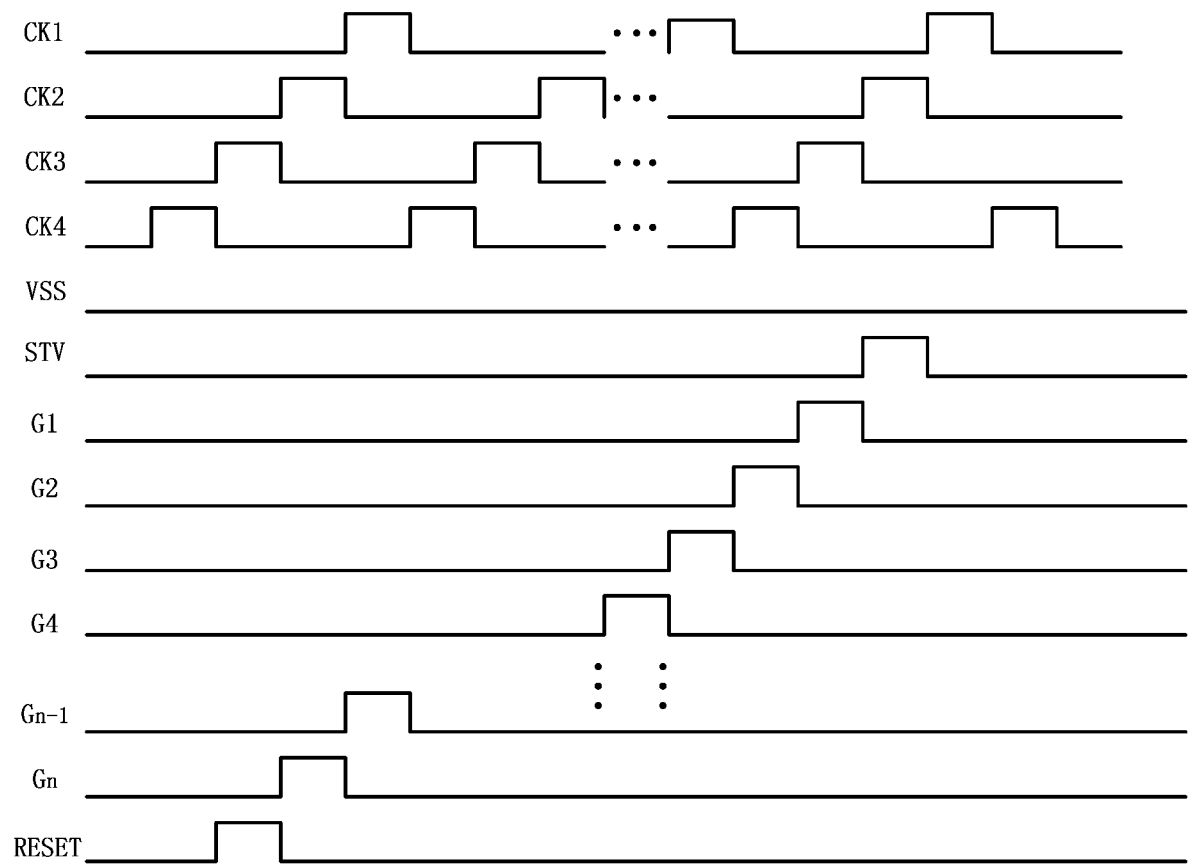
FIG. 10 is a driving timing diagram of a reverse scanning mode of the gate driving circuit as shown in FIG. 5 provided by an embodiment of the present disclosure.

For example, FIG. 10 is a timing diagram of the reverse scanning mode of the gate driving circuit as shown in FIG. 5 provided by embodiments of the present disclosure, and each stage of shift register in the shift registers SRn, SRn−1, . . . , SR1 can sequentially output a gate driving signal to a corresponding gate line of the gate lines Gn, Gn−1, . . . , G1.

The shift register, the gate driving circuit, the display panel and the driving method which are provided by the embodiments of the present disclosure can implement bidirectional scanning, reduce fluctuation of the output signal caused by clock hopping, and reduce the ratio of a turn-on time of the transistor so as to reduce shift of the threshold voltage of the transistor. For example, the shift register and the gate driving circuit provided by the embodiments of the present disclosure are simple in driving approaches, have a small number of thin film transistors and have low power consumption, and can implement a narrow frame on a display panel.

Although embodiments of the disclosure have been described above in details with general descriptions and specific embodiments, on the basis of embodiments of the disclosure, various changes and improvements may be made, which is apparent to those skilled in the art. Therefore, all such changes and improvements without departing from the spirit of the disclosure are within the scope of the claims of the disclosure.

The present application claims the priority of the Chinese Patent Application No. 201611073026.4 filed on Nov. 29, 2016, which is incorporated herein by reference in its entirety as part of the disclosure of the present application.

The invention claimed is:

1. A shift register, comprising:
an input and set circuit, connected with a pull-up node and configured to: in an input stage of forward scanning or a set stage of reverse scanning, receive a first clock signal and a first input signal, and in response to the first clock signal, write a voltage of the first input signal into the pull-up node;
a storage circuit, connected with the pull-up node and an output end respectively;
an output circuit, configured to provide a second clock signal to the output end when a voltage of the pull-up node satisfies an output condition;
a first pull-down circuit, configured to provide a first power voltage to the output end when a first pull-down condition is satisfied, and
a second pull-down circuit, configured to provide the first power voltage to the output end when a second pull-down condition is satisfied,
wherein the input and set circuit is further configured to: in a set stage of forward scanning or an input stage of reverse scanning, receive a third clock signal and a second input signal, and in response to the third clock signal, write a voltage of the second input signal into the pull-up node;
wherein the second pull-down circuit includes a seventh transistor, an eighth transistor and a third capacitor,
a first electrode of the seventh transistor is connected with the first power supply end to receive the first power voltage, a second electrode of the seventh transistor is connected with the output end, and a gate electrode of the seventh transistor is connected with a second pull-down node;
a first electrode of the eighth transistor is connected with the first power supply end to receive the first power voltage, a second electrode of the eighth transistor is connected with the second pull-down node, and a gate electrode of the eighth transistor is connected with the pull-up node; and
a first end of the third capacitor is connected with a fourth clock signal end to receive the fourth clock signal, and a second end of the third capacitor is connected with the second pull-down node.

2. The shift register according to claim 1, wherein the output circuit includes a first transistor, a first electrode of the first transistor is configured to receive the second clock signal, a second electrode of the first transistor is connected with the output end, and a gate electrode of the first transistor is connected with the pull-up node.

3. The shift register according to claim 1, wherein the storage circuit includes a first capacitor, a first end of the first capacitor is connected with the pull-up node, and a second end of the first capacitor is connected with the output end.

4. The shift register according to claim 1, wherein the input and set circuit includes a second transistor and a third transistor,
a first electrode of the second transistor is connected with a first input signal end to receive the first input signal, a second electrode of the second transistor is connected with the pull-up node, and a gate electrode of the second transistor is connected with a first clock signal end to receive the first clock signal; and a first electrode of the third transistor is connected with a second input signal end to receive the second input signal, a second electrode of the third transistor is connected with the pull-up node, and a gate electrode of the third transistor is connected with a third clock signal end to receive the third clock signal.

5. The shift register according to claim 1, wherein the first pull-down circuit includes a fourth transistor, a fifth transistor and a second capacitor, a first electrode of the fourth transistor is connected with a first power supply end to receive the first power voltage, a second electrode of the fourth transistor is connected with a first pull-down node, and a gate electrode of the fourth transistor is connected with the pull-up node; and a first electrode of the fifth transistor is connected with the first power supply end to receive the first power voltage, a second electrode of the fifth transistor is connected with the output end, and a gate electrode of the fifth transistor is connected with the first pull-down node; and a first end of the second capacitor is connected with a second clock signal end to receive the second clock signal, and a second end of the second capacitor is connected with the first pull-down node.

6. A gate driving circuit, comprising the shift register according to claim 1.

7. The gate driving circuit according to claim 6, comprising a plurality of cascaded shift registers, wherein except for a first-stage shift register and a last-stage shift register, a first input signal end of a current-stage shift register is connected with an output end of a previous-stage shift register; and a second input signal end of the current-stage shift register is connected with an output end of a next-stage shift register.

8. A display panel, comprising the gate driving circuit according to claim 6.

9. The display panel according to claim 8, further comprising gate lines, data lines and a plurality of pixel units defined by intersection of the gate lines and the data lines, the gate driving circuit being configured to provide gate driving signals to the gate lines.

10. A driving method for the shift register according to claim 1, comprising: executing operations of a forward scanning mode or executing operations of a reverse scanning mode, wherein:

the forward scanning mode includes a first reset stage, a first initialization stage, an input stage, an output stage, a set stage, a second initialization stage, a second reset stage and a third initialization stage; and the reverse scanning mode includes a first initialization stage, a first reset stage, a second initialization stage, an input stage, an output stage, a set stage, a third initialization stage and a second reset stage.

11. The driving method according to claim 10, wherein executing the operations of the forward scanning mode includes:

in the first reset stage, resetting a voltage of a pull-up node as a low level;

in the first initialization stage, initializing a voltage of an output end into the low level;

in the input stage, setting the voltage of the pull-up node as a pre-charge voltage level;

in the output stage, setting the voltage of the pull-up node as a bootstrap voltage level, and setting the voltage of the output end as a high level;

in the set stage, setting the voltage of the pull-up node as the pre-charge voltage level, and setting the voltage of the output end as the low level;

in the second initialization stage, initializing the voltage of the output end into the low level;

in the second reset stage, resetting the voltage of the pull-up node as the low level; and in the third initialization stage, initializing the voltage of the output end into the low level.

12. The driving method according to claim 10, wherein executing the operations of the reverse scanning mode includes:

in the first initialization stage, initializing the voltage of the output end into a low level;

in the first reset stage, resetting the voltage of the pull-up node as the low level;

in the second initialization stage, initializing the voltage of the output end into the low level;

in the input stage, setting the voltage of the pull-up node as a pre-charge voltage level;

in the output stage, setting the voltage of the pull-up node as a bootstrap voltage level, and setting the voltage of the output end as a high level;

in the set stage, setting the voltage of the pull-up node as the pre-charge voltage level, and setting the voltage of the output end as the low level;

in the third initialization stage, initializing the voltage of the output end into the low level; and in the second reset stage, resetting the voltage of the pull-up node as the low level.

13. A shift register, comprising:

an input and set circuit, connected with a pull-up node and configured to: in an input stage of forward scanning or a set stage of reverse scanning, receive a first clock signal and a first input signal, and in response to the first clock signal, write a voltage of the first input signal into the pull-up node;

a storage circuit, connected with the pull-up node and an output end respectively;

an output circuit, configured to provide a second clock signal to the output end when a voltage of the pull-up node satisfies an output condition;

a first pull-down circuit, configured to provide a first power voltage to the output end when a first pull-down condition is satisfied, and a second pull-down circuit, configured to provide the first power voltage to the output end when a second pull-down condition is satisfied, wherein the input and set circuit is further configured to: in a set stage of forward scanning or an input stage of reverse scanning, receive a third clock signal and a second input signal, and in response to the third clock signal, write a voltage of the second input signal into the pull-up node;

wherein the second pull-down circuit includes a seventh transistor, an eighth transistor and a third capacitor, a first electrode of the seventh transistor is connected with the first power supply end to receive the first power voltage, a second electrode of the seventh transistor is connected with the output end, and a gate electrode of the seventh transistor is connected with a second pull-down node;

a first electrode of the eighth transistor is connected with the first power supply end to receive the first power voltage, a second electrode of the eighth transistor is connected with the second pull-down node, and a gate electrode of the eighth transistor is connected with the pull-up node; and a first end of the third capacitor is connected with a fourth clock signal end to receive the fourth clock signal, and a second end of the third capacitor is connected with the second pull-down node, wherein the output circuit includes a first transistor, a first electrode of the first transistor is configured to receive the second clock signal, a second electrode of the first transistor is connected with the output end, and a gate electrode of the first transistor is connected with the pull-up node, wherein the storage circuit includes a first capacitor, a first end of the first capacitor is connected with the pull-up node, and a second end of the first capacitor is connected with the output end.

* * * * *